(12) United States Patent
Hong

(10) Patent No.: US 9,761,716 B2
(45) Date of Patent: Sep. 12, 2017

(54) SEMICONDUCTOR DEVICE AND FABRICATION METHOD THEREOF

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/883,675

(22) Filed: Oct. 15, 2015

(65) Prior Publication Data

US 2016/0111516 A1    Apr. 21, 2016

(30) Foreign Application Priority Data

Oct. 16, 2014 (CN) .......................... 2014 1 0548948

(51) Int. Cl.
| | |
|---|---|
| *H01L 21/768* | (2006.01) |
| *H01L 29/78* | (2006.01) |
| *H01L 21/762* | (2006.01) |
| *H01L 29/786* | (2006.01) |
| *H01L 29/417* | (2006.01) |
| *H01L 29/06* | (2006.01) |

(52) U.S. Cl.
CPC .... *H01L 29/7841* (2013.01); *H01L 21/76232* (2013.01); *H01L 21/76283* (2013.01); *H01L 29/0653* (2013.01); *H01L 29/41733* (2013.01); *H01L 29/78654* (2013.01)

(58) Field of Classification Search
CPC .................. H01L 21/76802; H01L 21/76805
See application file for complete search history.

(56) References Cited

U.S. PATENT DOCUMENTS

| | | | | |
|---|---|---|---|---|
| 2006/0231852 A1* | 10/2006 | Kususe | .................. | H01L 24/06 257/99 |
| 2012/0261792 A1* | 10/2012 | Cheng | ..................... | H01L 21/84 257/510 |
| 2013/0334603 A1* | 12/2013 | Cheng | ............... | H01L 21/76232 257/347 |

(Continued)

*Primary Examiner* — Jae Lee
(74) *Attorney, Agent, or Firm* — Anova Law Group, PLLC

(57) ABSTRACT

The present disclosure provides semiconductor devices and fabrication methods thereof. A stacked substrate includes an insulating layer between a substrate and a semiconductor layer. First openings are formed in the semiconductor layer to define a first distance between adjacent sidewalls of adjacent first openings. Spacers are formed on sidewall surfaces of each first opening. Second openings corresponding to the first openings are formed through the insulating layer and into the substrate. The sidewall surfaces of the substrate in the second openings are etched to define a second distance between adjacent substrate sidewalls of adjacent etched second openings. The second distance is shorter than the first distance. An isolation layer is formed in the first and second openings. Conductive structures are formed on the semiconductor layer on both sides of a gate structure formed on the semiconductor layer. The conductive structures penetrate through the isolation layer and into the substrate.

17 Claims, 6 Drawing Sheets

(56) References Cited

U.S. PATENT DOCUMENTS

| | | | |
|---|---|---|---|
| 2014/0048856 A1* | 2/2014 | Song | H01L 29/78 257/288 |
| 2014/0302661 A1* | 10/2014 | Cheng | H01L 21/84 438/424 |
| 2016/0020219 A1* | 1/2016 | Chuang | H01L 27/11573 257/324 |

* cited by examiner

SEMICONDUCTOR DEVICE AND FABRICATION METHOD THEREOF

CROSS-REFERENCES TO RELATED APPLICATIONS

This application claims the priority of Chinese patent application No. 201410548948.0, filed on Oct. 16, 2014, the entirety of which is incorporated herein by reference.

FIELD OF THE DISCLOSURE

The present disclosure generally relates to the field of semiconductor fabrication technologies and, more particularly, relates to semiconductor devices and fabrication methods.

BACKGROUND

The rapid advancement of semiconductor fabrication technology results in ever increasing component density and integration density of semiconductor devices. Currently, transistors are widely used as the basic semiconductor devices. As the component density and integration density increase, the gate dimension of transistors is getting smaller. However the shrinking gate dimension of transistors may result in short channel effect, which often causes leakage current and ultimately affects electrical characteristics of resultant semiconductor devices.

In order to improve transistor performance, to suppress short channel effect and to reduce leakage current, one method includes use of a semiconductor-on-insulator (SOI) substrate to form transistors. The semiconductor-on-insulator substrate includes a substrate, an insulating layer on the surface of the substrate, and a semiconductor layer on the surface of the insulating layer. The material of the substrate may be mono-crystalline silicon, the material of the insulating layer may be silicon oxide and the material of the semiconductor layer may be silicon or germanium.

The transistor gate structure is formed on the surface of the semiconductor layer. The transistor drain region and source region are formed on the surface of the semiconductor layer on both sides of the gate structure. The channel region is formed in the semiconductor layer at the bottom of the gate structure. Since the bottom of the semiconductor layer is insulated by the insulating layer, it is difficult for the carriers in the channel region of the semiconductor layer to enter the substrate under the insulating layer. The short channel effect may be suppressed and the leakage current in transistors may be reduced.

As the size of semiconductor devices continues to shrink and the integration density continues to increase, the size of transistors formed shrinks correspondingly. The fabrication method adapted to the reduced transistor size may use a semiconductor-on-insulator substrate with ultra-thin body and buried oxide (UTBB). The ultra-thin body indicates the semiconductor layer and the buried oxide indicates the insulating layer on the substrate. The semiconductor-on-insulator substrate with ultra-thin body and buried oxide (UTBB) is a substrate with a thin semiconductor layer and a thin insulating layer. The thin thickness of the semiconductor layer and the insulating layer reduces the transistor size formed, suppresses the short channel effect and reduces the leakage current in transistors.

However the transistors formed by employing the conventional semiconductor-on-insulator substrate with ultra-thin body and buried oxide (UTBB) still provide unstable performance.

SUMMARY

One aspect or embodiment of the present disclosure includes a method for forming a semiconductor device. A stacked substrate is provided including a substrate, an insulating layer on a surface of the substrate, a semiconductor layer on a surface of the insulating layer. A plurality of first openings is formed in the semiconductor layer to expose the insulating layer at a bottom surface of the plurality of first openings. A first distance is defined between adjacent sidewalls of adjacent first openings. Spacers are formed on sidewall surfaces of each first opening in the semiconductor layer. The insulating layer and the substrate are etched through the bottom surface of each first opening employing the semiconductor layer and the spacers as an etch mask to form a plurality of second openings through the insulating layer and into the substrate. The sidewall surfaces of the substrate exposed in the second openings are etched to define a second distance between adjacent substrate sidewalls of adjacent etched second openings. The second distance is shorter than the first distance. An isolation layer is formed in the plurality of second openings and the plurality of first openings. A gate structure is formed on a surface portion of the semiconductor layer between adjacent isolation layers. And conductive structures are formed on surface portions of the semiconductor layer on both sides of the gate structure. The conductive structures penetrate through the isolation layer and into the substrate of the stacked substrate.

Another aspect or embodiment of the present disclosure includes a semiconductor device including a stacked substrate. The stacked substrate includes a substrate, an insulating layer on a surface of the substrate, and a semiconductor layer on a surface of the insulating layer. The semiconductor layer includes a plurality of first openings therein to expose the insulating layer and to provide a first distance between adjacent sidewalls of adjacent first openings. The stacked substrate further includes a plurality of second openings located through the insulating layer and into the substrate at a bottom of the plurality of first openings. Sidewalls of the substrate in the plurality of second openings are recessed with respect to sidewalls of the semiconductor layer in the plurality of first openings. A second distance is defined between adjacent substrate sidewalls of adjacent second openings. The second distance is shorter than the first distance. An isolation layer is located in the plurality of second openings and the plurality of first openings. A gate structure is on a surface portion of the semiconductor layer between adjacent isolation layers. Conductive structures are on surface portions of the semiconductor layer on both sides of the gate structure. The conductive structures are configured to penetrate through the isolation layer and into the substrate of the stacked substrate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
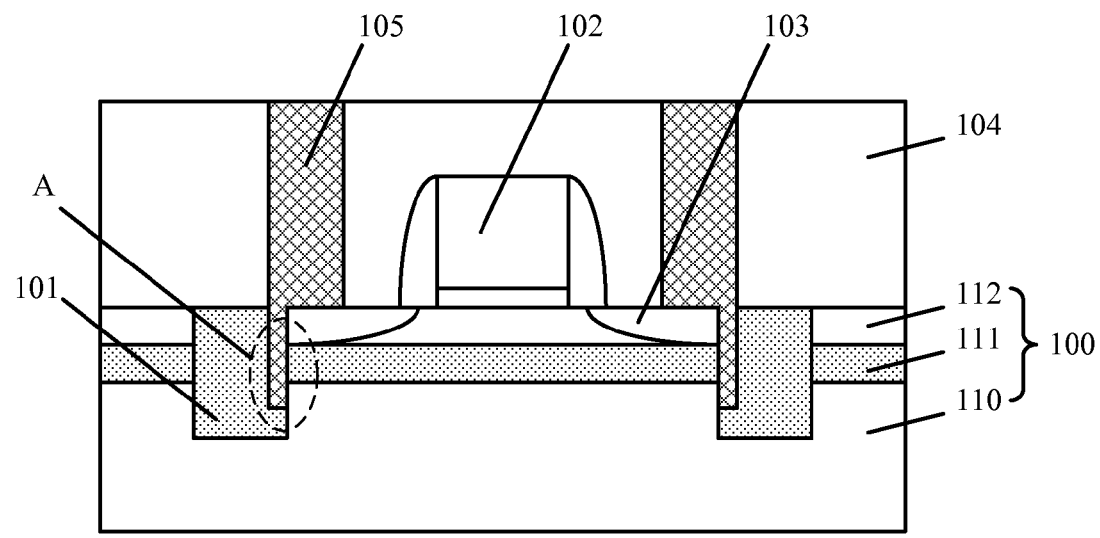
FIG. 1 illustrates a cross-sectional structure diagram of a transistor formed on a semiconductor-on-insulator substrate with ultra-thin body and buried oxide (UTBB)

Transistors formed on a conventional semiconductor-on-insulator substrate with ultra-thin body and buried oxide (UTBB) may provide unstable performance. FIG. 1 illustrates a cross-sectional diagram of a transistor formed on a semiconductor-on-insulator substrate with ultra thin body and buried oxide.

As shown in FIG. 1, the transistor includes a stacked substrate 100, including a substrate 110, an insulating layer 111 on the surface of the substrate 110, and a semiconductor layer 112 on the surface of the insulating layer 111. A plurality of isolation structures 101 is located inside the semiconductor layer 112, the insulating layer 111 and the substrate 110. The bottoms of the isolation structures 101 are located within the substrate 110. A gate structure 102 is located on the surface of the semiconductor layer 112 between adjacent isolation structures 101. A source region and a drain region 103 are located in the semiconductor layer 112 on both sides of the gate structure 102. A dielectric layer 104 is located on the surface of the semiconductor layer 112, the isolation structures 101 and the gate structure 102. Electrically conductive plugs 105 are located inside the dielectric layer 104 and on the surface of the source region and the drain region 103.

The semiconductor layer 112 between adjacent isolation structures 101 defines the active regions of transistors. As the critical dimension (CD) of transistors continues to shrink, the active region dimension reduces accordingly. In other words, the distance between adjacent isolation structures 101 decreases. The reduction of the active region dimension and the deviation of the photolithography process may easily cause the bottoms of some electrically conductive plugs 105 to overlap with some isolation structures 101.

Specifically, the process for forming the electrically conductive plug 105 includes: by employing an etching process, through-holes are formed through the dielectric layer 104 until the surface of the semiconductor layer 112 is exposed. The through-holes are filled with an electrically conductive filling material to form an electrically conductive plug 105. Because the dielectric layer 104 and the isolation structures 101 include insulating materials such as silicon oxide, when the forming locations of the electrically conductive plugs 105 partially overlap with the isolation structures 101, the etching process for forming the through-holes in the dielectric layer 104 may inadvertently etch the isolation structures 101. As a result, the bottoms of the through-holes are formed under the surface of the semiconductor layer 112 and subsequently the bottoms of the electrically conductive plugs 105 are formed under the surface of the semiconductor layer 112.

Because the substrate 100 is a semiconductor-on-insulator substrate with ultra thin body and buried oxide, the thickness of the semiconductor layer 112 and the insulating layer 111 is thin, e.g., less than about 50 nanometers. Hence, the etching process for forming the through-holes is easy to cause the bottoms of the through-holes to be formed into or under the surface of the substrate 110. Consequently, the bottoms of the electrically conductive plugs 105 are formed under the surface of the substrate 110, causing short-circuits between the semiconductor layer 112 and the substrate 110, as shown in region A of FIG. 1. The subsequently formed transistor is not functional.

The present disclosure provides a semiconductor device and fabrication method. In the fabrication method, a plurality of first openings is formed in a semiconductor layer of an SOI wafer to expose an insulating layer of the SOI wafer. Spacers are formed on sidewall surfaces of the semiconductor layer in the first openings. The spacers protect the sidewalls of the semiconductor layer during a subsequent etching process for forming second openings and for etching the substrate sidewalls exposed by the second openings. After the substrate sidewalls of the second openings are etched, the distance between the substrate sidewalls of adjacent etched second openings is reduced to a second distance. Because the sidewalls of the semiconductor layer in the first openings are protected by the spacers, the first distance between adjacent first openings does not decrease. The process for etching the substrate sidewalls of the SOI wafer via the second openings allows the second distance to be shorter than the first distance. Because the second distance is shorter than the first distance, the substrate sidewalls in the second openings are recessed with respect to the sidewalls of the semiconductor layer. After conductive structures are formed on the substrate surface of the SOI substrate on both sides of the gate structure, the bottoms of the conductive structures may not contact the substrate. Further, even if the bottoms of the conductive structures penetrate through the isolation layer and extend into the substrate of the SOI substrate, the conductive structures and the substrate sidewalls are still electrically isolated by the isolation layer, because the substrate sidewalls in the second openings are recessed with respect to the sidewalls of the semiconductor layer. As such, no short-circuit may be formed between the semiconductor layer and the substrate of the SOI substrate through the conductive structures. The subsequently formed transistors may thus provide stable performance and improved yield.

Figure 11:
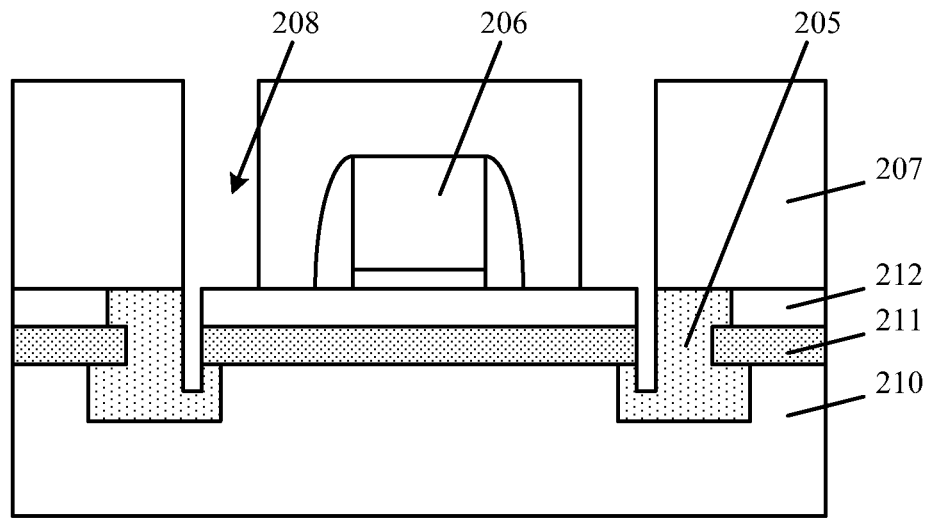
Figure 12:
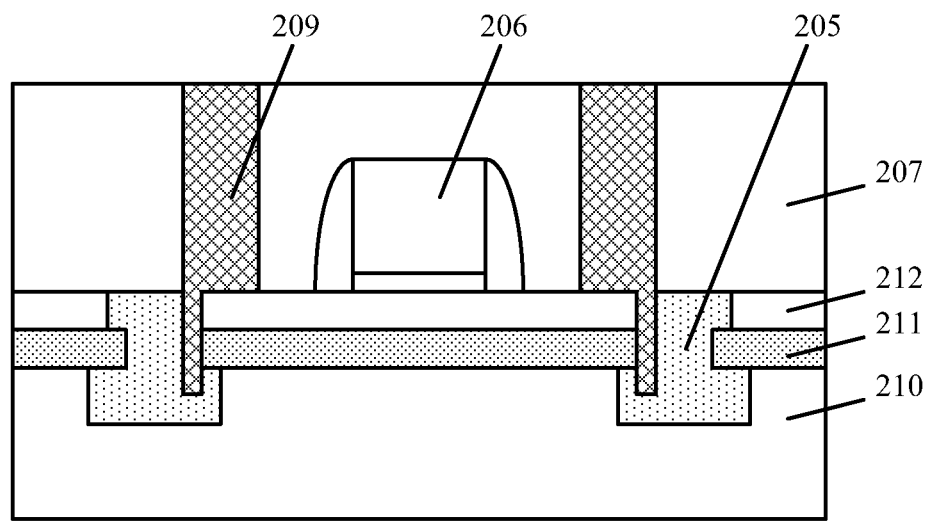
Figure 13:
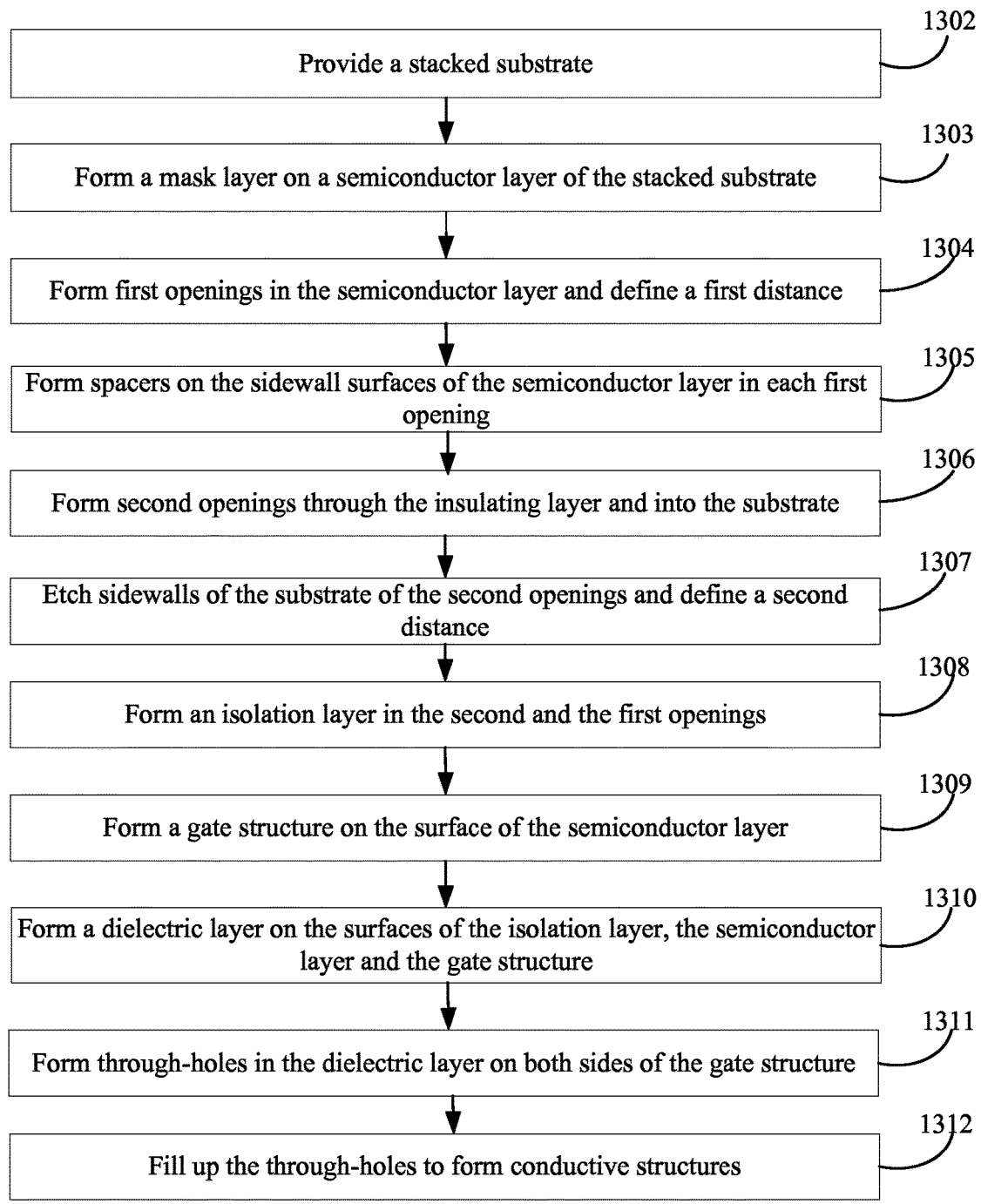
FIG. 13 illustrates an exemplary method for forming a semiconductor device consistent with various disclosed embodiments of the present disclosure.

FIG. 13 illustrates an exemplary method for fabricating a semiconductor device, while FIG. 2 through FIG. 12 illustrate corresponding structures of the semiconductor device at certain stages during the exemplary formation method consistent with various disclosed embodiments.

Figure 2:
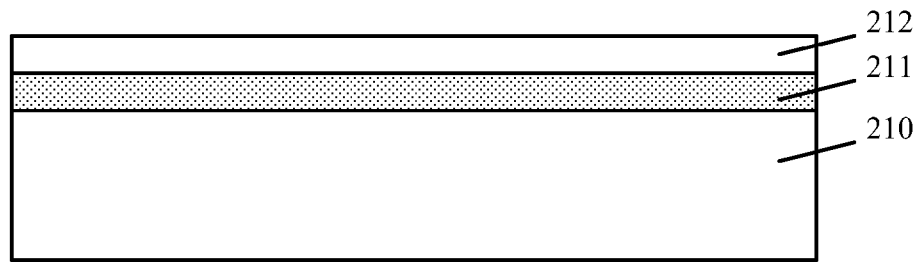
FIGS. 2 through 12 illustrate cross-sectional structure diagrams of an exemplary semiconductor device at certain stages during a formation process consistent with various disclosed embodiments of the present disclosure.

Referring to FIG. 2, one embodiment provides a stacked substrate, including a substrate 210, an insulating layer 211 on the surface of the substrate 210, and a semiconductor layer 212 on the surface of the insulating layer 211 (e.g., in Step 1302 of FIG. 13).

The stacked substrate can be a semiconductor-on-insulator (SOI) substrate. The substrate 210 is configured to support the insulating layer 211, the semiconductor layer 212, and the subsequently formed semiconductor device inside or on the surface of the semiconductor layer 212.

The material of the substrate 210 includes silicon. The material of the semiconductor layer 212 includes silicon or germanium. When the material of the semiconductor layer 212 is silicon, the stacked substrate is a silicon-on-insulator substrate. When the material of the semiconductor layer 212 is germanium, the stacked substrate is a germanium-on-insulator substrate. Depending on the material of the semiconductor layer 212 (e.g., silicon or germanium), the carriers in the semiconductor layer 212 can have different mobility efficiencies to satisfy different technical requirements.

In one embodiment, the stacked substrate is a semiconductor-on-insulator substrate with an ultra thin body and a buried oxide. The semiconductor layer 212 has a thickness between about 5 nm to about 20 nm. The insulating layer 211 has a thickness between about 5 nm to about 40 nm. After a gate structure is formed on the surface of the semiconductor layer 212, a channel region is subsequently formed in the semiconductor layer 212 at the bottom of the gate structure. Because the semiconductor layer 212 is thin, the channel region is thin as well. Because the insulating layer 211 and the substrate 210 are electrically isolated, the leakage current can be effectively eliminated in the formed transistor. Therefore, the short channel effect of the formed transistor can be suppressed and the transistor performance can be improved.

Figure 3:
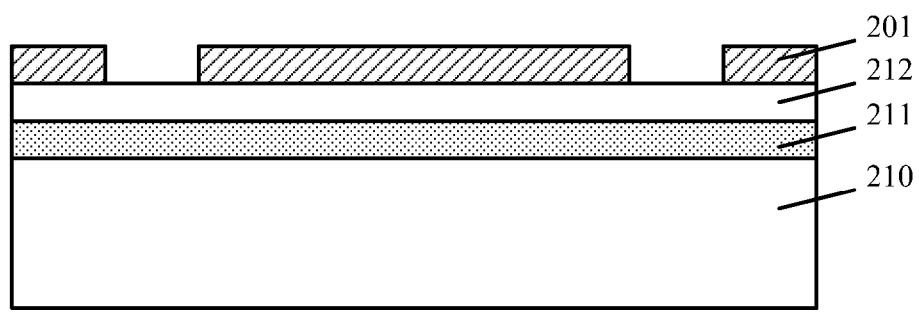

Referring to FIG. 3, a mask layer 201 is formed on the surface of the semiconductor layer 212 (e.g., in Step 1303 of FIG. 13). The mask layer 201 exposes certain portion of the surface of the semiconductor layer 212.

The mask layer 201 is employed as a mask for the subsequent etching to form the first openings. Second openings can be formed at the bottoms of the first openings. An isolation layer can be formed in the first openings and second openings. The isolation layer can include a shallow trench isolation (STI) structure. The semiconductor layer 212 between adjacent isolation layers can be used as active regions for the transistor.

The material of the mask layer 201 includes one or more of SiN, SiON, SiOCN, SiOBN and SiO2. The mask layer 201 has a thickness between about 50 Å and about 500 Å. The process for forming the mask layer 201 includes the followings. A mask material film is formed on the surface of the semiconductor layer 212. A patterned layer is formed on the surface of the mask material film, exposing the position and the structure corresponding to the subsequently formed first openings. By employing the patterned layer as an etch mask, the mask material film is etched until the surface of the semiconductor layer 212 is exposed. The remaining mask material film forms the mask layer 201.

Further, the process for forming the mask material film includes atomic layer deposition (ALD), physical vapor deposition (PVD) or chemical vapor deposition (CVD). The process for etching the mask material film includes anisotropic dry etching, such that the pattern of the formed mask layer 201 and the pattern of the patterned layer are substantially identical. The patterned layer may be a patterned photoresist layer, or can be a mask layer formed by employing multi-patterning process, such as self-aligned double patterning (SADP) process.

When the patterned layer is a photoresist layer, the process for forming the patterned layer includes the followings. A positive photoresist film is applied on the surface of the mask material film. The positive photoresist film is light exposed and then developed to remove the photoresist film in the region corresponding to the first openings. The patterned photoresist layer is formed.

When the patterned layer is formed by employing the SADP process, the process for forming the patterned layer includes the followings. A sacrificial layer is formed on surface portions of the mask material film. A pattern film is formed on the surfaces of the mask material film and the sacrificial layer. The pattern film is etched back until the surface of the sacrificial layer is exposed. The exposed sacrificial layer is then removed and remaining portion of the pattern film forms the patterned layer.

Figure 4:
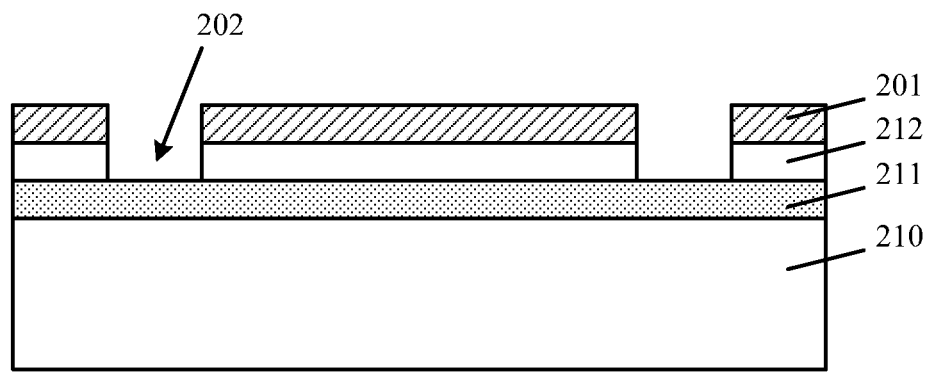

Referring to FIG. 4, by employing the mask layer 201, the semiconductor layer 212 is etched until the surface of the insulation layer 211 is exposed. A plurality of first openings 202 are formed in the semiconductor layer 212. A first distance (D1 in FIG. 7) is a distance between adjacent first openings 202 (e.g., in Step 1304 of FIG. 13).

The first openings 202 and the second openings that are subsequently formed at the bottoms of the first openings 202 are configured to form an isolation layer. The isolation layer is configured to isolate the active region formed in the semiconductor layer 212.

The process for etching the semiconductor layer 212 includes an anisotropic dry etching process. The sidewall surfaces of the first openings 202 are perpendicular to the surface of the semiconductor layer 212. After etching, the etched pattern of the semiconductor layer 212 and the pattern of the mask layer 201 are substantially identical.

In one embodiment, the material of the semiconductor layer 212 includes silicon. The parameters of the process for the anisotropic dry etching of the semiconductor layer 212 include the followings. The etching gases include chlorine, hydrogen bromide or the combination of both. The flow rate of hydrogen bromide is between about 200 milliliter per minute and about 800 milliliter per minute. The flow rate of chlorine is between about 20 milliliter per minute and about 100 milliliter per minute. The etching gases may also include an inert gas. The flow rate of the inert gas is between about 50 milliliter per minute and about 1000 milliliter per minute. The pressure of the etching chamber is between about 2 millitorr and about 200 millitorr. The etching time duration is between about 15 seconds and about 60 seconds.

The process for etching the semiconductor layer 212 is terminated, when the surface of the insulating layer 211 is reached. The first openings 202 are formed in the semiconductor layer 212. Only the sidewalls of the semiconductor layer 212 are exposed in the first openings 202. The spacers are formed on the sidewall surfaces of the first openings 202. The spacers are able to protect the sidewall surfaces of the semiconductor layer 212.

Subsequently, the second openings are formed. The sidewalls of the substrate 210 are exposed. When the sidewalls of the substrate 210 in the second openings are etched, the spacers continue to protect the sidewall surfaces of the semiconductor layer 212 so that sidewalls of the substrate 210 in the second openings are recessed with respect to the sidewalls of the semiconductor layer 212 in the first openings. Therefore, even if the electrically conductive plugs penetrate through the first and the second openings, and the bottoms of the conductive structures extend into the substrate 210, e.g., due to the process deviation, the bridging between the semiconductor layer 212 and the substrate 210 will not cause short-circuit through the conductive structures. The above process ensures the performance stability of the transistors formed.

Figure 5:
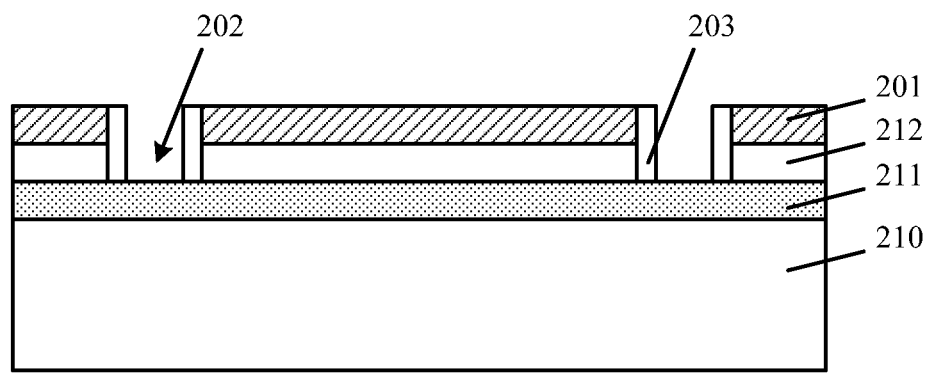

Referring to FIG. 5, spacers 203 are formed at least on the sidewall surfaces of the semiconductor layer 212 in the first openings 202 and also on a surface of the insulating layer 211 (e.g., in Step 1305 of FIG. 13).

The process for forming the spacers 203 includes the followings. A spacer film is formed on the surface of the mask layer 201 and on the sidewall and the bottom surfaces of the first openings 202. The spacer film is etched back until the surface of the mask layer 201 and the surface of the insulating layer 211 at the bottom of the first openings 202 are exposed. The spacers 203 are formed on the sidewall surfaces of the first openings 202, sidewall surfaces of the mask layer 201, and also on a surface of the insulating layer 211.

The material of the spacers 203 includes one or more of silicon oxide, silicon nitride, silicon oxynitride, polysilicon and amorphous carbon. The spacer film has a thickness between about 20 Å and about 200 Å. The thickness of the spacer film determines the thickness of the spacers 203 to be formed. The process for etching back includes an anisotropic dry etching process. Because the etching direction is perpendicular to the surface of the substrate 210, certain portion of the spacer film on the sidewall surfaces of the first openings 202 remains unchanged and forms the spacers 203. The parameters for the anisotropic dry etching process include the followings. The temperature is between about 20° C. and about 80° C. The pressure is between about 5 millitorr and about 50 millitorr. The etching gas may include fluorocarbon-containing gas such as $CF_4$, $C_4F_8$, $CH_3F$, $CH_2F_2$ and/or $CHF_3$. The etching gas may further include oxygen and a carrier gas. The carrier gas may include nitrogen and/or other suitable inert gas. The flow rate of the etching gas is between about 20 sccm and about 200 sccm.

The spacers 203 are configured to protect the sidewall surfaces of the semiconductor layer 212 exposed in the first openings 202. After the second openings are formed at the bottoms of the first openings 202, the spacers 203 are able to protect the sidewall surfaces of the semiconductor layer 212 from being etched when the substrate 210 sidewalls exposed in the second openings are etched. When substrate 210 sidewalls are etched, the distance between the sidewalls of adjacent first openings is not reduced. The sidewalls of the substrate 210 are recessed with respect to the sidewalls of the semiconductor layer 212. So the short-circuit issue between the semiconductor layer 212 and the substrate 210 can be avoided after the conductive structures are subsequently formed.

In one embodiment, after the first openings 202 are formed, the mask layer 201 on the surface of the semiconductor layer 212 is retained. When the spacers 203 are formed and specifically when the spacer film is etched back, the mask layer 201 is able to protect the surface of the semiconductor layer 212 from being etched. Further, when the second openings are subsequently formed and sidewalls of the substrate 210 exposed in the second openings are etched, the mask layer 201 continues to protect the sidewall surfaces of the semiconductor layer 212 from being damaged.

Figure 6:
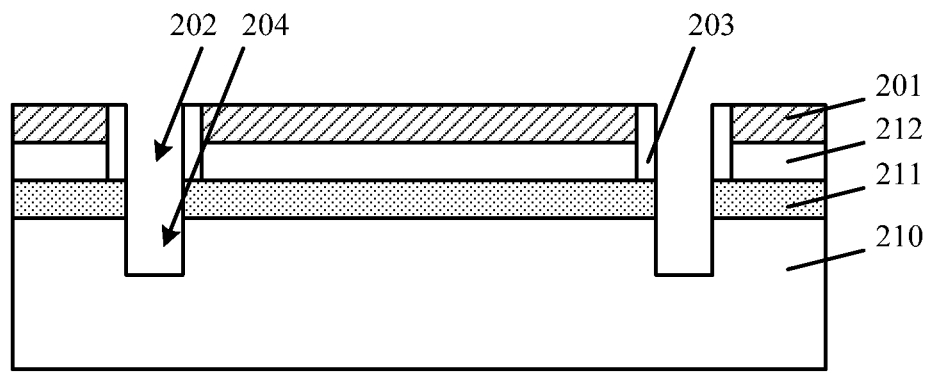

Referring to FIG. 6, by employing the semiconductor layer 212 and the spacers 203 as an etch mask, the insulating layer 211 and substrate 210 at the bottoms of the first openings are etched. A plurality of second openings 204 are formed in the insulating layer 211 and into the substrate 210 (e.g., in Step 1306 of FIG. 13).

An isolation layer is formed in the second openings 204 and the first openings 202. The thickness of the insulating layer 211 and the semiconductor layer 212 is sufficiently thin. In order to achieve sufficient isolation effect, the bottom of the isolation layer needs to be extended into the substrate 210. Hence, the process for forming the second openings 204 needs to etch the insulating layer 211 and the substrate 210 at the bottoms of the first openings 202. The bottoms of the second openings 204 can be extended into the substrate 210. In one embodiment, the depth of the second openings 204 formed by etching is between about 50 nm and about 300 nm.

The process for forming the second openings 204 includes an anisotropic dry etching process. The sidewalls of the formed second openings 204 are perpendicular to the surface of the substrate 210. In one embodiment, a mask layer 201 covers the semiconductor layer 212. By employing the mask layer 201 and the spacers 203 as an etch mask, the process for forming the second openings 204 makes sidewalls of the second openings coplanar with the sidewall surfaces of the spacers 203, as shown in FIG. 6.

The parameters for the anisotropic dry etching process include the followings. The etching gases include chlorine, hydrogen bromide, fluorocarbon gas and/or an inert gas. The pressure of the etching chamber is between about 2 millitorr and about 200 millitorr. The bias power is greater than about 100 W. The bias voltage is greater than about 10 volts.

Figure 7:
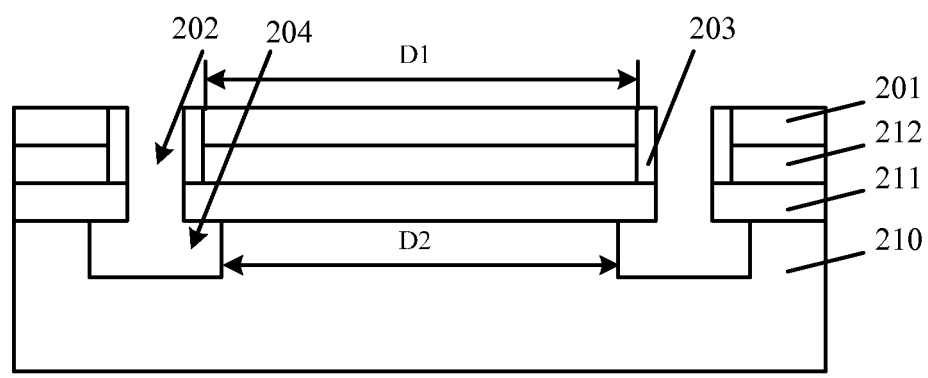

Referring to FIG. 7, sidewalls of the substrate 210 exposed in the second openings are etched. A second distance D2 is defined between substrate sidewalls of adjacent etched second openings 204. The second distance D2 is shorter the first distance D1 (e.g., in Step 1307 of FIG. 13).

The etching of the sidewalls of the substrate 210 exposed in the second openings 204 defines the second distance D2 between adjacent etched second openings 204. Further, the second distance D2 is shorter than the first distance D1 between the sidewalls of the first openings 202 as shown in FIG. 7. The sidewalls of the substrate 210 are recessed with respect to the sidewalls of the semiconductor layer 212. After an isolation layer is formed in the first and the second openings 202/204, even if the conductive structures formed on the surface of the semiconductor layer 212 may penetrate through the isolation layer due to the process deviation, the bottoms of the conductive structures will not contact the substrate 210. Electrical contact between the substrate 210 and the semiconductor layer 212 through the conductive structures can be avoided. In one embodiment, the thickness being etched on the sidewalls of the substrate 210 exposed in the second openings 204 is between about 5 nm and about 20 nm. After the second openings are formed, the difference between the second distance D2 and the first distance D1 is greater than about 10 nm.

In one embodiment, the isotropic etching process is used to etch sidewalls of the substrate 210 exposed in the second openings 204. The isotropic etching process has a large etching rate in all directions on the substrate 210. Both the bottom and the sidewall surfaces of the substrate 210 in the second openings 204 are etched. So the distance between sidewalls of the substrate 210 of adjacent etched second openings 204 is reduced to the second distance D2.

The isotropic etching process may be a dry or a wet etching process. In one embodiment, the material of the substrate 210 includes silicon. When the isotropic etching process is a dry etching process, the etching gases of the dry etching include one or both of chlorine and hydrogen bromide. The bias power is less than about 100 W. The bias voltage is less than about 10 volts. When the isotropic etching process is a wet etching process, the solution of the wet etching process may be an acidic solution, such as nitric acid solution.

In the isotropic etching process, the sidewall surfaces of the semiconductor layer 212 are protected by the spacers 203 and the top surfaces of the semiconductor layer 212 are protected by the mask layer 201. So the etching process does not cause any damage to the sidewall surfaces or the top surfaces of the semiconductor layer 212. The distance between the sidewalls of adjacent first openings remains as the first distance D1. The first distance D1 is greater than the second distance D2. Hence, the sidewall surfaces of the substrate 210 are recessed with respect to the sidewall surfaces of the semiconductor layer 212.

Figure 8:
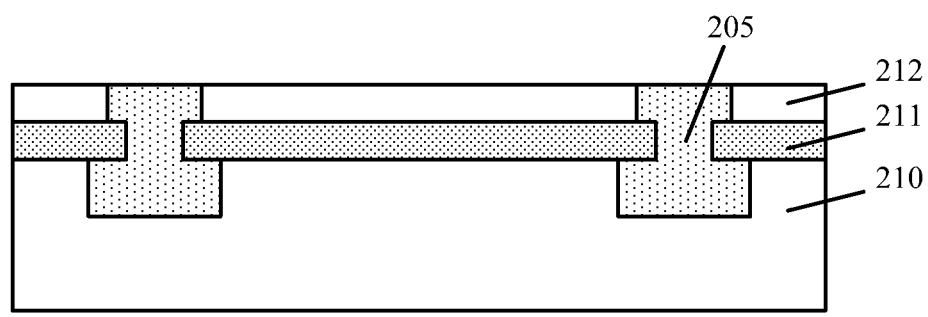

Referring to FIG. 8, after sidewalls of the substrate 210 in the second openings 204 are etched, an isolation layer 205 is formed (e.g., in Step 1308 of FIG. 13) in the second openings 204 (as shown in FIG. 7) and the first openings 202 (as shown in FIG. 7).

The method for forming the isolation layer 205 includes the followings. An isolation film is formed in the second openings 204 and the first openings 202 and on the surface of the semiconductor layer 212 to fill up the second openings 204 and the first openings 202. The isolation film is planarized until the surface of the semiconductor layer is exposed. Then the isolation layer 205 is formed.

Further, the process for forming the isolation film may be a chemical vapor deposition process, a physical vapor deposition process, or an atomic layer deposition process. The depositing process for forming the isolation film is required to have sufficient coverage so that the isolation film being formed can bond as desired with the sidewalls in the first openings 202 and the sidewalls in the second openings 204. For example, the atomic layer deposition process is one of such processes. The material of the isolation film includes silicon oxide, silicon nitride, silicon oxynitride, low K dielectric materials or ultra-low K dielectric materials. The material of the isolation film and the material of the insulating layer 211 may be the same or different. In one embodiment, the material of the isolation film is silicon oxide and the material of the isolation film is the same as the material of the insulating layer 211.

The planarization process may be a chemical mechanical polishing (CMP) process. In one embodiment, the semiconductor layer 212 is covered by the mask layer 201. The chemical mechanical polishing process is able to stop at the surface of the mask layer 201. After the surface of the mask layer 201 is exposed, an etching process, in particular a wet etching process may be employed to remove the mask layer 201. It is also possible to continue to employ the chemical mechanical polishing process to planarize the isolation film and the mask layer 201 until the surface of the semiconductor layer 212 is exposed.

In one embodiment, after the planarization process exposes the mask layer 201, the chemical mechanical polishing process is employed to planarize the isolation film and the mask layer 201 until the surface of the semiconductor layer 212 is exposed. An isolation layer 205 is formed. The mask film on the surface of the semiconductor layer 212 is removed. A gate structure may be formed subsequently on the exposed surface of the semiconductor layer 212 to thus form a transistor.

In one embodiment, before the isolation layer 205 is formed, the spacers 203 (as shown in FIG. 7) are removed. In other words, before the isolation film is formed in the first openings 202 and the second openings 204, the spacers 203 are removed, as shown in FIG. 8. The process for removing the spacers 203 may be a wet or dry etching process. In another embodiment, before the isolation layer 205 is formed, the spacers 203 are retained.

Figure 9:
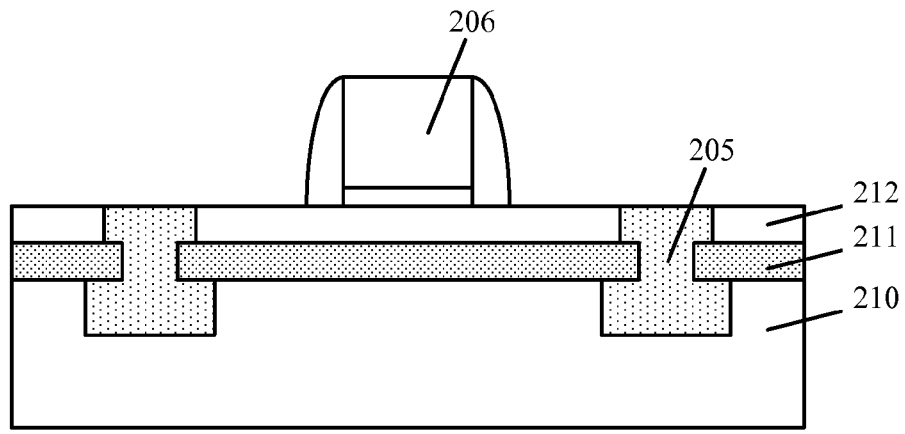

Referring to FIG. 9, after the isolation layer 205 is formed, a gate structure 206 is formed (e.g., in Step 1309 of FIG. 13).

The gate structure 206 includes: a gate dielectric layer on the surface of the semiconductor layer 212, a gate electrode layer on the surface of the gate dielectric layer and the gate sidewall spacers on the sidewall surfaces of the gate dielectric layer and the gate electrode layer.

In one embodiment, the material of the gate dielectric layer is silicon oxide. The material of the gate electrode layer is polysilicon. The material of the gate sidewall spacers includes one or more of silicon oxide, silicon nitride, and silicon oxynitride. The process for forming a gate structure 206 includes the followings. A gate dielectric film is formed on the surface of the isolation layer 205. A gate electrode film is formed on the surface of the gate dielectric film. The gate electrode film and the gate dielectric film are etched until the surfaces of the isolation layer 205 and the semiconductor layer 212 are exposed. A gate dielectric layer and a gate electrode layer are then formed. A spacer film is formed on the surfaces of the isolation layer 205, the semiconductor layer 212, the gate dielectric layer and the gate electrode layer. The spacer film is etched back until the surfaces of the semiconductor layer 212 and the isolation layer 205 are exposed to form the gate sidewall spacers.

In another embodiment, the material of the gate dielectric layer is a high K (dielectric constant) dielectric material. The material of the gate electrode layer is a metal. The material of the gate sidewall spacers includes one or more of silicon oxide, silicon nitride and silicon oxynitride.

The process for forming the gate structure 220 is a gate last process. The gate last process includes the followings. A dummy gate electrode layer is formed on the surface of the semiconductor layer 212. Sidewall spacers are formed on the sidewall surfaces of the dummy gate electrode layer. A first sub-dielectric layer is formed on the surface of the isolation layer 205 and the semiconductor layer 212. The first sub-dielectric layer covers the sidewall spacer surfaces. The surface of the first sub-dielectric layer is coplanar with the surface of the dummy gate electrode layer. The dummy gate electrode layer is removed. A third opening is formed in the first sub-dielectric layer. A gate dielectric layer is formed at the bottom of the third opening. A gate electrode layer is formed on the surface of the gate dielectric layer to fill up the third opening.

Source and the drain regions are formed in the semiconductor layer 212 on both sides of the gate structure 206. The source and the drain regions are doped with N-type or P-type ions. The conductive structure subsequently formed is located on the surfaces of the source and the drain regions.

In one embodiment, the material of the gate dielectric layer is silicon oxide. The material of the gate electrode layer is polysilicon. After the gate structure 206 is formed, the source and the drain regions are formed in the semiconductor layer 212 by employing the ion implantation process.

In another embodiment, the material of the gate dielectric layer is a high K dielectric material. The material of the gate electrode layer is a metal. Before the first sub-dielectric layer is formed, the source and the drain regions are formed in the semiconductor layer 212 by employing the ion implantation process on both sides of the gate sidewall spacers and the dummy gate electrode layer.

Figure 10:
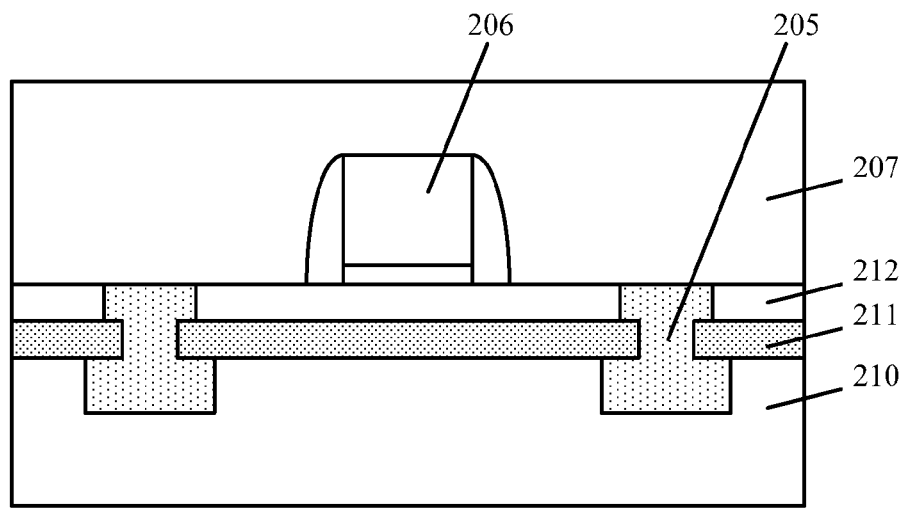

Referring to FIG. 10, a dielectric layer 207 is formed on the surfaces of the isolation layer 205, the semiconductor layer 212 and the gate structure 206 (e.g., in Step 1310 of FIG. 13).

The dielectric layer 207 is configured to electrically isolate the gate structure and the subsequently formed conductive structures. The material of the dielectric layer 207 and the material of the isolation layer 205 may be the same or different. The material of the dielectric layer includes silicon oxide, silicon nitride, silicon oxynitride, low K dielectric materials or ultra-low K dielectric materials. In one embodiment, the material of the dielectric layer 207 is silicon oxide. The process for forming the dielectric layer 207 includes a chemical vapor deposition process, a physical vapor deposition process or an atomic layer deposition process.

In one embodiment, the material of the gate dielectric layer is silicon oxide. The material of the gate electrode layer is polysilicon. The process for forming the dielectric layer 207 includes the following. A dielectric film is deposited on the surfaces of the isolation layer 205, the semiconductor layer 212 and the gate structure 206. A chemical mechanical polishing process is applied to the dielectric film to form the dielectric layer 207 and to planarize the surface of the formed dielectric layer 207.

In another embodiment, the material of the gate dielectric layer is a high K (dielectric constant) dielectric material. The material of the gate electrode layer is a metal. The process for forming the dielectric layer 207 includes the followings. A second sub-dielectric layer is deposited on the surface of the first sub-dielectric layer and on the top surface of the gate structure 206. The second sub-dielectric layer and the first sub-dielectric layer construct the dielectric layer 207.

Referring to FIG. 11, the dielectric layer 207 is etched until the surface of the semiconductor layer 212 on both sides of the gate structure 206 is exposed. Through-holes 208 are formed in the dielectric layer 207 (e.g., in Step 1311 of FIG. 13).

The through-holes 208 are configured to form the conductive structures located on the surface of the source and the drain regions. Hence, in one embodiment, the through-holes 208 expose the surfaces of the source and the drain regions on both sides of the gate structure 206. The process for forming the through-holes 208 includes the followings. A through-hole mask film is formed on the surface of the dielectric layer 207. The through-hole mask film exposes the surfaces of the dielectric layer 207 corresponding to the through-holes 208 that need to be formed. By employing the anisotropic dry etching process, the through-hole mask film is used as an etch mask to etch the dielectric layer 207 until the surface of the semiconductor layer 212 is exposed to form the through-holes 208.

The material of the through-hole mask film may be a photoresist material. Then the through-hole mask film is formed by employing a photolithography process. The material of the through-hole mask film may also be one or more of silicon oxide, silicon oxynitride, silicon nitride and amorphous carbon. The through-hole mask film is formed by etching the mask of a patterned photoresist layer. The patterned photoresist layer is formed by employing a photolithography process.

As the dimension of semiconductor device continues to shrink, the dimension of the active region isolated by the isolation layer 205 reduces correspondingly. The distance between adjacent first openings 202 (as shown in FIG. 7) decreases as well. Due to restrictions on the alignment accuracy or resolution of the photolithography process, the through-holes 208 may not be completely located on the surface of the semiconductor layer 212. The through-holes 208 may readily expose some part of the surface of the isolation layer 205 on both sides of the gate structure 206.

Further, in one embodiment, since the dielectric layer 207 and the isolation layer 205 have the same material of silicon oxide, the etching process for forming the through-holes 208 may easily cause damages to the isolation layer 205, such that the bottoms of the through-holes 208 penetrates into the isolation layer 205. The bottoms of the through-holes 208 extend into the semiconductor layer 212 and the isolation layer 205.

In one embodiment, since the thickness of the semiconductor layer 212 and the insulating layer 211 is thin, the process for etching the through-holes 208 is likely to make the bottoms of the through-holes 208 located in the isolation layer to extend into the substrate 210. In other words, the through-holes 208 may expose the sidewalls of the semiconductor layer 212 and the substrate 210.

Referring to FIG. 12, a conductive material fills up in the through-holes 208 (as shown in FIG. 11). The conductive structures 209 are formed on the substrate surfaces on both sides of the gate structure 206 (e.g., in Step 1312 of FIG. 13).

In one embodiment, the conductive structures 209 are configured to apply bias voltages to the source and the drain regions. Hence the conductive structures 209 are located on the surfaces of the source and the drain regions respectively.

The material of the conductive structures 209 includes copper, aluminum and/or tungsten. The process for forming the conductive structures 209 includes the followings. A conductive film is formed on the surface of the dielectric layer 207 and inside the through-holes 208. The conductive film completely fills up the through-holes 208. The conductive film is planarized until the surface of the dielectric layer 207 is exposed to form the conductive structures 209.

The process for forming the conductive film includes a physical vapor deposition process, an electroplating process or a chemical plating process. The planarization process includes a chemical mechanical polishing process. In one embodiment, before the conductive film is formed, a barrier film may be formed on the surface of the dielectric layer 207 and on the sidewall and bottom surfaces of the through-holes 208. After the conductive film is planarized, the barrier film is planarized until the surface of the dielectric layer 207 is exposed to form the barrier layer. The material of the barrier layer includes one or more of titanium, titanium nitride, tantalum and tantalum nitride.

Since the bottoms of the through-holes 208 may penetrate into the isolation layer 205, the bottoms of the conductive structures 209 formed within the through-holes 208 may be located within the isolation layer 205. Further, in one embodiment, the bottoms of the through-holes 208 may extend into the substrate 210 under the top surface of the substrate 210. However, since the second distance D2 between sidewalls of the substrate 210 of adjacent second opening 204 (as shown in FIG. 7) is shorter than the first distance D1 between sidewalls of adjacent first openings 202 (as shown in FIG. 7), the substrate sidewalls of the second openings 204 are recessed with respect to the sidewalls of the semiconductor layer 212 in the first openings 202. Hence, the bottoms of the conductive structures 209 formed in the through-holes 208 and the substrate 210 are isolated by part of the isolation layer 205. The conductive structures 209 thus do not cause short-circuit between the semiconductor layer 212 and the substrate 210. Therefore the stability of the formed transistors is provided.

As such, in one embodiment, after first openings are formed in the semiconductor layer 212 exposing the insulating layer 211, spacers 203 are formed on the sidewall surfaces of the semiconductor layer 212 in the first openings 202. The spacers 203 are configured to protect the sidewalls of the semiconductor layer 212 when the second openings 204 are formed by etching and when sidewalls of the substrate 210 exposed in the second openings 204 are etched. After the sidewalls of the substrate 210 in the second openings 204 are etched, the distance between the substrate sidewalls of adjacent etched second openings is reduced to the second distance D2.

Because the sidewall surfaces of the semiconductor layer 212 in the first openings 202 are protected by the spacers 203, the first distance D1 between adjacent first openings 202 is not reduced. So the process for etching sidewalls of the substrate 210 in the second openings 204 makes the second distance D2 shorter than the first distance D1. Because the second distance D2 is shorter than the first distance D1, the substrate sidewalls in the second openings 204 are recessed with respect to the sidewalls of the semiconductor layer 212.

After the conductive structures 209 are formed on the substrate surfaces on both sides of the gate structure 206, the bottoms of the conductive structures 209 are unlikely to contact the substrate 210. Further, even if the bottoms of the conductive structures 209 penetrate into the isolation layer 205 and extend into the substrate 210, because the substrate sidewalls of the second openings 204 are recessed with respect to the sidewalls of the semiconductor layer 212, the conductive structures 209 and the substrate sidewalls are electrically isolated by the isolation layer 205. So the semiconductor layer 212 and the substrate 210 do not get short-circuited through the conductive structures 209. Therefore, the transistors formed as disclosed provide stable performance and improved yield.

Accordingly, the present disclosure also provides a semiconductor structure. Referring to FIG. 12, the semiconductor structure includes a stacked substrate. The stacked substrate includes a substrate 210, an insulating layer 211 on the surface of the substrate 210 and a semiconductor layer 212 on the surface of the insulating layer 211. A plurality of first openings 202 are formed through the semiconductor layer 212. The bottoms of the first openings 202 expose part of the surface of the insulating layer 211 and a first distance D1 is defined between adjacent first openings 202. A plurality of second openings 204 are formed in the insulating layer 211 and the substrate 210 at the bottom of the first openings 202. The sidewalls of the insulating layer 211 in the second openings 204 are coplanar with or protruding into the sidewalls of the semiconductor layer 212 in the first openings 202. The substrate sidewalls in the second openings 204 are recessed with respect to the sidewalls of the semiconductor layer 212 in the first openings 202. A second distance D2 is defined between the substrate sidewalls of adjacent etched second openings. The second distance D2 is shorter than the first distance D1. An isolation layer 205 is formed in the second openings 204 and the first openings 202. Conductive structures 209 are formed on the substrate 210 surfaces on both sides of the gate structure 206.

In various embodiments, the stacked substrate is a semiconductor-on-insulator substrate. The substrate 210 is configured to support the insulating layer 211, the semiconductor layer 212, and the semiconductor devices subsequently formed in the semiconductor layer 212 or on the surface of the semiconductor layer 212. The material of the substrate 210 is silicon. The material of the semiconductor layer 212 may be silicon or germanium. When the material of the semiconductor layer 212 is silicon, the substrate is a silicon-on-insulator substrate. When the material of the semiconductor layer 212 is germanium, the substrate is a germanium-on-insulator substrate. Depending on the material of the semiconductor layer 212 (e.g., silicon or germanium), the semiconductor layer 212 has different carrier mobility efficiencies to satisfy different technical requirements.

In one embodiment, the stacked substrate is a semiconductor-on-insulator substrate with an ultra thin body and a buried oxide. The thickness of the semiconductor layer 212 is between about 5 nm and about 20 nm. The thickness of the insulating layer 211 is between about 5 nm and about 40 nm. After a gate structure 206 is subsequently formed on the surface of the semiconductor layer 212, the semiconductor layer 212 at the bottom of the gate structure 206 is configured to form the channel region. Since the thickness of the semiconductor layer 212 is thin, the thickness of the channel region is thin as well. The insulating layer 211 and the substrate 210 are electrically isolated at the bottom of the channel region. The transistors formed in such way effectively avoid generating a leakage current, suppress the short channel effect and have improved performance.

The first distance between sidewalls of adjacent first openings 202 is greater than the second distance between the substrate sidewalls of adjacent etched second openings 204. The difference between the second distance and the first distance is greater than 10 nm.

The material of the isolation layer 205 includes silicon oxide, silicon nitride, silicon oxynitride, low K dielectric materials or ultra-low K dielectric materials. The material of the isolation layer 205 and the material of the insulating layer 211 may be the same or different. In one embodiment, the material of the isolation film is silicon oxide. The material of the isolation film and the material of the insulating layer 211 are the same.

In one embodiment, the spacers 203 are formed on the sidewall surfaces of the semiconductor layer 212 in the first openings. The material of the spacers 203 includes silicon oxide, silicon nitride, silicon oxynitride, polysilicon, amorphous carbon, or a combination thereof. The thickness of the spacers 203 is between about 20 Å and about 200 Å.

The gate structure 206 includes: a gate dielectric layer on the surface of the semiconductor layer 212; a gate electrode layer on the surface of the gate dielectric layer; and gate sidewall spacers on the sidewall surfaces of the gate dielectric layer and the gate electrode layer. In one embodiment, the material of the gate dielectric layer is silicon oxide. The material of the gate electrode layer is polysilicon. In another embodiment, the material of the gate dielectric layer is a high K dielectric material. The material of the gate electrode layer is a metal. The material of the gate sidewall spacers includes one or more of silicon oxide, silicon nitride and silicon oxynitride.

In one embodiment, the semiconductor layer 212 on both sides of the gate structure 206 has a source region and a drain region. The source and the drain regions are doped with N-type or P-type ions. The conductive structures 209 are located on the surface of the source and the drain regions.

The dielectric layer 207 is configured to electrically isolate the gate structure 206 and the conductive structures 209. The material of the dielectric material layer 207 and the isolation layer 205 may be the same or different. The material of the dielectric layer 207 includes silicon oxide, silicon nitride, silicon oxynitride, low K dielectric materials or ultra-low K dielectric materials. In one embodiment, the material of the dielectric layer 207 is silicon oxide.

Part of the bottoms of the conductive structures 209 is located on the surface of the isolation layer 205 and in the isolation layer 205. In one embodiment, the bottoms of the conductive structure 209 extend under the bottom surface of the insulating layer 211. The conductive structures 209 and the substrate sidewalls are isolated by part of the isolation layer 205.

The material of the conductive structures 209 includes copper, tungsten and/or aluminum. Between the conductive structures 209 and the dielectric layer 207 is a barrier layer (not shown). The material of the barrier layer includes one or more of titanium, titanium nitride, tantalum and tantalum nitride.

In this manner, a second distance is defined between the substrate sidewalls of adjacent etched second openings 204. A first distance is defined between adjacent first openings 202. The second distance is shorter than the first distance. The substrate sidewalls of the second openings 204 are recessed with respect to the sidewalls of the semiconductor layer 212. Hence, even if the bottoms of the conductive structures 209 penetrate through the isolation layer and extend into the substrate 210 from the top surface of the substrate 210, the conductive structures 209 and the substrate sidewalls are still electrically isolated by the isolation layer 205. As a result, the semiconductor layer 212 and the substrate 210 do not get shorted through the conductive structures 209. Therefore, the resultant transistors provide stable performance.

Other applications, advantages, alternations, modifications, or equivalents to the disclosed embodiments are obvious to those skilled in the art.

What is claimed is:

1. A method for forming a semiconductor device, comprising:
    providing a stacked substrate including a substrate, an insulating layer on a surface of the substrate, a semiconductor layer on a surface of the insulating layer;
    forming a plurality of first openings in the semiconductor layer without etching the insulating layer to expose the insulating layer at a bottom surface of the plurality of first openings, wherein a first distance is defined between adjacent sidewalls of adjacent first openings;
    for spacers on side wall surfaces of each first opening in the semiconductor layer;
    etching the insulating layer and the substrate through the bottom surface of each first opening employing the semiconductor layer and the spacers as an etch mask to form a plurality of second openings through the insulating layer and into the substrate;
    etching sidewall surfaces of the substrate exposed in the second openings to define a second distance between adjacent substrate sidewalls of adjacent etched second openings, wherein the second distance is shorter than the first distance;
    forming an isolation layer in the plurality of second openings and the plurality of first openings;
    forming a gate structure on a surface portion of the semiconductor layer between adjacent isolation layers; and
    forming conductive structures on surface portions of the semiconductor layer on both sides of the gate structure, wherein the conductive structures penetrate into the isolation layer, wherein a width of the isolation layer in the substrate is bigger than a width of the isolation layer in the semiconductor layer, and the width of the isolation layer in the semiconductor layer is bigger than a width of the isolation layer in the insulating layer.

2. The method according to claim 1, wherein the stacked substrate is a semiconductor-on-insulator substrate having an ultra-thin body as the semiconductor layer and a buried oxide as the insulating layer of the stacked substrate.

3. The method according to claim 1, wherein the semiconductor layer has a thickness between about 5 Å and about 20 Å and the insulating layer has a thickness between about 5 Å and about 40 Å.

4. The method according to claim 1, wherein the step of forming the conductive structures includes:

forming a dielectric layer on the isolation layer, the semiconductor layer and the gate structure;
    etching the dielectric layer to expose the surface portions of the semiconductor layer on both sides of the gate structure;
    forming through-holes in the dielectric layer; and
    filling the through-holes with a conductive material to form the conductive, structures.

5. The method according to claim 4, wherein the through-holes ala expose a portion of the isolation layer, and a bottom part of the conductive structures is located on a surface of the isolation layer or inside the isolation layer.

6. The method according to claim 5, wherein the bottom part of the conductive structures extend into the isolation layer and under a top surface of the substrate.

7. The method according to claim 1, wherein the step of forming the first openings includes:
    forming a mask layer on the semiconductor layer to expose surface portions of the semiconductor layer corresponding to the first openings to be formed; and
    using the mask layer as an etch mask to etch the semiconductor layer until the insulating layer is exposed to form the first openings.

8. The method according to claim 7, wherein the mask layer is removed after the substrate sidewalls exposed in the second openings are etched.

9. The method according to claim 8, wherein the step for forming the spacers includes:
    forming a sidewall film on the mask layer and on side all surfaces and bottom surfaces of the first openings;
    etching back the sidewall film to expose the mask layer and a surface portion of the insulating layer at the bottom of the first openings to form the spacers on the sidewall surfaces of the first openings and on another surface portion of the insulating layer.

10. The method according to claim 1, wherein the spacers are made of a material including one or more of silicon oxide, silicon nitride, silicon oxynitride, polysilicon, and amorphous, carbon.

11. The method according to claim 1, wherein the isotropic etching process is used when the substrate sidewalls exposed in the second openings are etched.

12. The method according to claim 1, wherein the step of etching the sidewall surfaces of the substrate exposed in the second openings includes an anisotropic dry etching process, such that sidewalls of the etched second openings are formed perpendicular to the surface of the substrate.

13. The method according to claim 1, wherein the step of forming the isolation layer includes:
    forming an isolation film in the second openings and the first openings and on the semiconductor layer to fill up the second openings and the first openings; and
    planarizing the isolation film until the semiconductor layers exposed to form the isolation layer.

14. The method according to claim 1, wherein the gate structure includes: a gate dielectric layer on the semiconductor layer; a gate electrode layer on the gate dielectric layer; and gate sidewall spacers on sidewall surfaces of the gate dielectric layer and the gate electrode layer.

15. The method according to claim 1, further including:
    forming a source region and a drain region in the semiconductor layer on both sides of the gate structure before forming the conductive structures, wherein the conductive structures are located on the source region and the drain region.

16. The method according to claim 1, further including:
removing the spacers in the first openings prior to forming the isolation layer.

17. The method according to claim 1, wherein the step of etching sidewall surfaces of the substrate exposed in the second openings is perform instantly after the step of etching the insulating layer and the substrate through the bottom surface of each first opening.

* * * * *